United States Patent
Pan et al.

(10) Patent No.: US 10,734,834 B2
(45) Date of Patent: Aug. 4, 2020

(54) STATIC TRANSFER SWITCH WITH RESONANT TURN-OFF

(71) Applicant: ABB Schweiz AG, Baden (CH)

(72) Inventors: Zhiguo Pan, Cary, NC (US); Adil Oudrhiri, Richmond, VA (US); Zichi Zhang, Västerås (SE); Yu Du, Raleigh, NC (US)

(73) Assignee: ABB SCHWEIZ AG, Baden (CH)

( * ) Notice: Subject to any disclaimer, the term of this patent is extended or adjusted under 35 U.S.C. 154(b) by 159 days.

(21) Appl. No.: 15/997,120

(22) Filed: Jun. 4, 2018

(65) Prior Publication Data
US 2019/0372389 A1   Dec. 5, 2019

(51) Int. Cl.
*H02J 9/06* (2006.01)
*H02J 3/18* (2006.01)
*H02J 7/00* (2006.01)
*H02J 4/00* (2006.01)
*H03K 17/56* (2006.01)

(52) U.S. Cl.
CPC ............... *H02J 9/061* (2013.01); *H02J 3/18* (2013.01); *H02J 7/00* (2013.01); *H02J 4/00* (2013.01); *H03K 17/56* (2013.01)

(58) Field of Classification Search
CPC ...... H02J 9/06; H02J 9/00; H02J 9/061; H02J 7/00; H02J 7/007; H02J 3/36; H02J 4/00; H02M 3/18; H03K 5/00; H03K 17/005; H03K 17/00; H03K 17/56; H01H 83/00; H01H 1/00; H02H 7/10
See application file for complete search history.

(56) References Cited

U.S. PATENT DOCUMENTS

| | | |
|---|---|---|
| 4,210,846 A | 7/1980 | Dennis et al. |
| 5,343,140 A | 8/1994 | Gegner |
| 5,436,786 A | 7/1995 | Pelly et al. |

(Continued)

FOREIGN PATENT DOCUMENTS

| | | |
|---|---|---|
| CN | 101540493 A | 9/2009 |
| EP | 3240004 A1 | 11/2017 |

(Continued)

OTHER PUBLICATIONS

Meyer et al.; Solid-State Circuit Breaker Based on Active Thyristor Topologies; IEEE Transactions on Power Electronics, vol. 21, No. 2, Mar. 2006; 9 pgs.; Piscataway, New Jersey.

(Continued)

*Primary Examiner* — Rexford N Barnie
*Assistant Examiner* — Jagdeep S Dhillon
(74) *Attorney, Agent, or Firm* — Taft Stettinius & Hollister LLP; J. Bruce Schelkopf

(57) ABSTRACT

A resonant turn-off circuit is provided to disconnect an inadequate power source and transfer a load to an alternate power source. In the circuit, a main switch is turned off before the AC cycle of the power source crosses zero. As a result, the main switch may be turned off quickly to transfer electric power supplied to a load to a second power source. The circuit may include resonant switches, a capacitor, a pre-charging power supply and an inductor. When it is desired to turn off the main switch, a resonant switch is turned off to cause a voltage reversal across the switch.

20 Claims, 4 Drawing Sheets

(56) References Cited

U.S. PATENT DOCUMENTS

| | | | | |
|---|---|---|---|---|
| 5,689,164 | A | * | 11/1997 | Hoft .................... H02P 25/0925 318/400.17 |
| 5,694,007 | A | | 12/1997 | Myers |
| 5,770,897 | A | * | 6/1998 | Bapat ........................ H02J 3/38 307/125 |
| 9,467,112 | B2 | | 10/2016 | English et al. |
| 2004/0070278 | A1 | * | 4/2004 | Divan .................... H02J 3/0073 307/64 |
| 2006/0226706 | A1 | * | 10/2006 | Edelen .................... H02J 9/062 307/64 |
| 2010/0264743 | A1 | * | 10/2010 | Jung ........................ H02J 9/061 307/80 |
| 2011/0205675 | A1 | | 8/2011 | Divan |
| 2014/0028110 | A1 | | 1/2014 | Petersen et al. |
| 2014/0029313 | A1 | * | 1/2014 | Telefus ............. H02M 3/33523 363/21.02 |
| 2014/0097690 | A1 | * | 4/2014 | Costa ........................ H02J 9/00 307/64 |
| 2014/0254223 | A1 | | 9/2014 | Limpaecher |
| 2014/0292105 | A1 | * | 10/2014 | Hsieh .................... H03K 17/005 307/115 |
| 2016/0182037 | A1 | | 6/2016 | Srihari et al. |
| 2016/0197517 | A1 | * | 7/2016 | Bundschuh ............... H02J 3/32 307/64 |
| 2016/0218557 | A1 | * | 7/2016 | Cinti ..................... H02M 7/483 |
| 2017/0178844 | A1 | | 6/2017 | Angquist et al. |

FOREIGN PATENT DOCUMENTS

| | | | | |
|---|---|---|---|---|
| WO | WO-2005083864 | A3 | * | 11/2005 .............. H02J 3/005 |
| WO | 2012104580 | A2 | | 8/2012 |
| WO | 2014177874 | A2 | | 11/2014 |

OTHER PUBLICATIONS

ABB Product Brochure; Cyberex SuperSwitch 3 technology 200-4000A digital static transfer switch; 2015; 8 pgs.

International Search Report and Written Opinion issued in corresponding international application No. PCT/US2019/035283, dated Aug. 20, 2019, 7 pp.

Lu et al., "A 13.56 MHz CMOS Active Rectifier With Switched-Offset and Compensated Biasing for Biomedical Wireless Power Transfer Systems", IEEE Transactions on Biomedical Circuits and Systems, vol. 8, No. 3, Jun. 2014, 11 pp.

* cited by examiner

STATIC TRANSFER SWITCH WITH RESONANT TURN-OFF

BACKGROUND

The present inventions relate generally to static transfer switches, and more particularly, to turning off the switches therein.

A static transfer switch (STS) is a known type of electrical component that is used to distribute electric power to sensitive loads. For example, static transfer switches are commonly used to supply electric power to data centers or other industrial plants or facilities where constant, reliable power is necessary.

A static transfer switch is used to switch between multiple power sources to supply a load with electric power. For example, one power source, such as an electric grid, may be a primary power source, and a second power source, such as a generator, may be a backup power source. Both power sources are supplied to the static transfer switch which supplies power to the load. During normal conditions, the static transfer switch monitors the primary power source and a backup power source, and supplies power from the primary power source to the load. When the power from the primary power source deteriorates, the static transfer switch switches to the backup power source to supply the load. Such switching is designed to happen quickly enough that the load is not affected by the switch between power supply sources.

In order to achieve the desired switching speed and reliability, static transfer switches use "static" switching, meaning that solid-state power electronics are used to switch between power sources. However, even with the use of solid-state power electronics, switching speed is a concern with static transfer switches. For example, deterioration in the primary power source can happen suddenly, and it is important to switch away from a deteriorating primary power source quickly. That is, many of the electrical components, for example in a data center, are particularly sensitive to power supply fluctuations. Moreover, the timing of the switching between the two power sources must be seamless. Thus, for example, it is undesirable for a delay in disconnecting a power source to result in a spike in power by temporarily having multiple power sources connected to the load or to allow a gap in power by temporarily having no power source connected to the load. Therefore, it is important in a static transfer switch to be able to disconnect a power source as quickly as possible when switching between power sources.

SUMMARY

A static transfer switch is described that turns off a power source is less than half an AC cycle. This allows the static transfer switch to switch between two power sources quickly to maintain adequate electric power to sensitive loads. The circuit includes two main switches and two resonant switches. At least one of the resonant switches is turned on to turn off a main switch.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
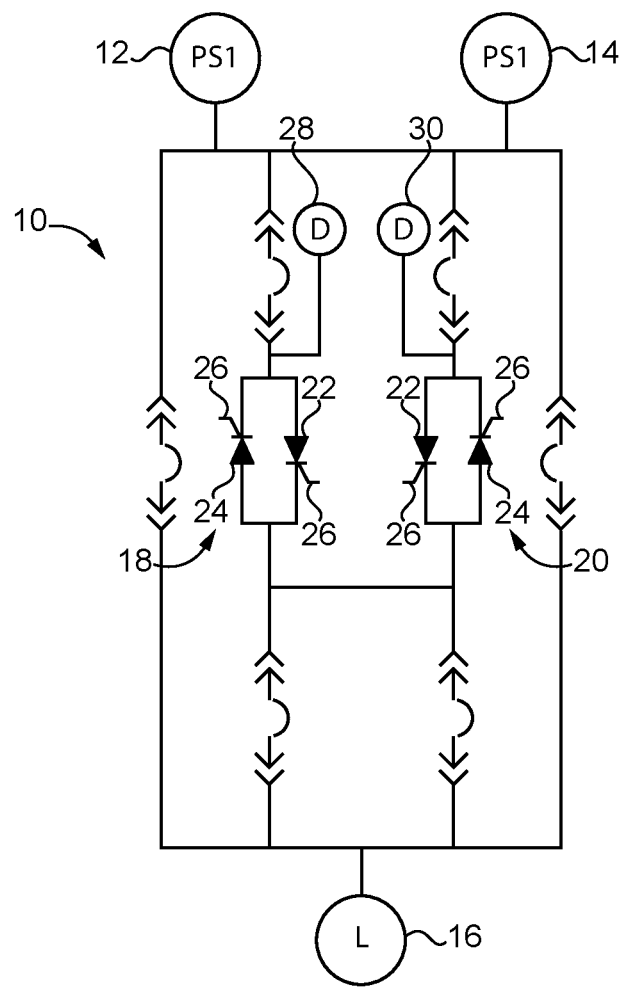
FIG. 1 is a circuit diagram of static transfer switch.

Referring now to the figures, and particularly FIG. 1, a circuit diagram is shown for a static transfer switch 10. As shown, the static transfer switch 10 is supplied with a first power source 12 and a second power source 14. The output of the static transfer switch 10 is connected to a load 16, such as a data center. Switching between the power sources 12, 14 is accomplished through the use of corresponding sets 18, 20 of first and second main switches 22, 24. Preferably, the main switches 22, 24 are thyristors or gate turn-off thyristors (GTO). The main switches 22, 24 are arranged anti-parallel to each other, such that when AC power is supplied to the switches 22, 24 from the power source 12, 14, and the main switches 22, 24 are turned on, positive polarity half cycles of the AC power are conducted by the first main switch 22 and negative polarity half cycles of the AC power are conducted by the second main switch 24.

The main switches 22, 24 are turned on to conduct electric power by supplying a first gate 26 signal to the gates 26 of the first and second main switches 22, 24. Once turned on, each of the main switches 22, 24 typically continues to conduct electric power even after the first gate 26 signal is no longer being supplied to the gates 26 of the switches 22, 24. In order to turn off the main switches 22, 24 to stop each of the main switches 22, 24 from conducting electric power, the voltage applied across the main switch 22, 24 may be reversed. When the power source 12, 14 is an AC power source, a voltage reversal suitable to turn off the main switches 22, 24 occurs at every half cycle of the AC power source. For example, if the main switches 22, 24 are turned on by gate 26 signals (and the gate 26 signal is immediately removed), a positive polarity first half cycle will conduct through the first main switch 22. Then, when the AC cycle reaches the zero crossing, the first main switch 22 will turn off due to the reversal of polarity. The negative polarity second half cycle then conducts through the second main switch 24. Once the AC cycle again reaches the zero crossing, the second main switch 24 turns off due to the reversal of polarity.

In order to prevent the main switches 22, 24 from naturally turning off at each zero crossing of the AC power source, a constant or constantly pulsed first gate 26 signal may be supplied to the gates 26 of one set 18, 20 of main switches 22, 24 during the time that electric power is desired from the power source 12, 14 connected to the set 18, 20 of switches 22, 24. Thus, when electric power is no longer desired from the first power source 12, the first gate 26 signal is removed from the first set 18 of main switches 22, 24, and the first gate 26 signal is applied to the second set 20 of main switches 22, 24. As a result, the main switches 22, 24 in the first set 18 naturally turn off during the next two AC half cycles, and the main switches 22, 24 in the second set 20 turn on to conduct electric power from the second power source 14 to the load 16.

In order to determine when to switch between power sources 12, 14, first detectors 28, 30 may be provided to monitor the electric performance of the first and second power sources 12, 14. Thus, when the first detector 28 for the first power source 12 senses a deterioration of performance in the first power source 12, the first set 18 of main switches 22, 24 are turned off by removing the first gate 26 signal and the second set 20 of main switches 22, 24 are turned on to supply power from the second power source 14. Since it is desirable to only supply electric power to the load 16 from one power source 12, 14 at a time, it may be necessary to wait to turn on the second set 20 of main switches 22, 24 until the AC power of the first power source 12 cross zero once or twice to ensure that both switches 22, 24 in the first set 18 have been turned off. Thus, switching time may require one half or one complete AC cycle. It is understood that where the power sources 12, 14 have multiple phases, each phase of each power source 12, 14 will be controlled by one set 18, 20 of the main switches 22, 24. Thus, where three phase power is used with two power sources 12, 14, a total of six sets 18, 20 of main switches 22, 24 would be used.

Figure 2:
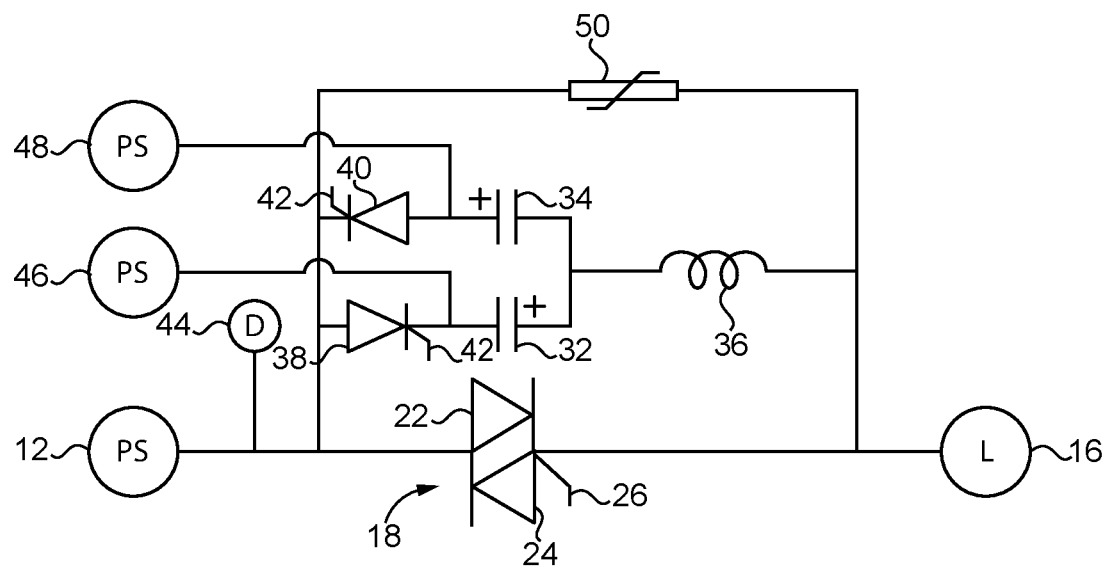
FIG. 2 is a circuit diagram of a resonant turn-off circuit.

Turning to FIG. 2, a circuit diagram is shown for reversing the voltage across at least one of the main switches 22, 24 before an AC polarity reversal would otherwise turn off the switch 22, 24 after the gate 26 signal has been stopped. Thus, the switch 22, 24 can be turned off quickly without having to wait for the AC power to reach a zero crossing. As shown, the circuit is provided with at least one capacitor 32, 34 and an inductor 36. The capacitors 32, 34 and inductor 36 are arranged parallel with the first and second main switches 22, 24. First and second resonant switches 38, 40 are also provided which are arranged in series with the capacitors 32, 34 and inductor 36 and arranged in parallel with main switches 22, 24.

When it is desired to turn off the main switches 22, 24, the first gate 26 signal is removed from the gates 26 of the main switches 22, 24 as described above. A second gate 42 signal is then also supplied to the gate 42 of at least one of the resonant switches 38, 40 to apply a reverse voltage across the conducting main switch 22, 24 to turn off the conducting main switch 22, 24 before the AC polarity change would naturally turn off the conducting main switch 22, 24. For example, if the AC power source 12 is supplying a positive polarity half cycle when it is desired to turn off the main switches 22, 24, the first main switch 22 will be conducting electrical power to the load 16 when the first gate 26 signal is removed. Since the voltage is reversed relative to the second main switch 24, the second main switch 24 will not be conducting when the first gate 26 signal is removed and will remain off once the AC cycle reverses again since the first gate 26 signal has been removed. Thus, no extra steps are needed to turn off the second main switch 24.

Continuing with the example, when the second gate 42 signal is supplied to the first resonant switch 38, the charge in the first capacitor 32 is released and a resonant frequency is generated between the first capacitor 32 and the inductor 36. The resonant frequency is much higher than the frequency of the AC power source 12 and causes a voltage reversal across the first main switch 22 to turn off the first main switch 22 well before the AC power source 12 would turn off the first main switch 22 itself by crossing zero. Preferably, a second detector 44 is provided to monitor the polarity of the power source 12 supplied to the main switches 22, 24. Thus, if the polarity is positive, the second gate 42 signal will be supplied to the first resonant switch 38 to turn off the first main switch 22, and if the polarity is negative, the second gate 42 signal will be supplied to the second resonant switch 40 to turn off the second main switch 24. It is possible that the first 28, 30 and second 44 detectors may be combined.

Although thyristors or GTOs are preferred in a static transfer switch 10 for the main switches 22, 24 because of the performance requirements of the main switches 22, 24. The resonant switches 38, 40 may not need to satisfy the same performance requirements since the resonant switches 38, 40 are only used intermittently. Therefore, the resonant switches 38, 40 may be thyristors, gate turn-off thyristors (GTO), insulated-gate bipolar transistors (IGBT), or metal-oxide-semiconductor field-effect transistors (MOSFET). It may also be possible for the resonant switches 38, 40 to have lower capacity ratings than the main switches 22, 24.

Preferably, power supplies 46, 48 are connected to the capacitors 32, 34 to pre-charge the capacitors 32, 34 and provide a maintenance charge thereafter. As shown in FIG. 2, where two capacitors 32, 34 are used with one being in series with each of the resonant switches 38, 40, it may be desirable to have two power supplies 46, 48 with each one connected to one of the capacitors 32, 34. Because each of capacitors 32, 34 is used to turn off a different main switch 22, 24, opposite charges may be applied to each of the capacitors 32, 34 to provide the appropriate voltage reversal needed to turn off each of the main switches 22, 24. It may also be possible to combine the power supplies 46, 48 with two DC outputs.

A resistor 50 may also be arranged in parallel with the capacitor 32, 34 and inductor 36. Preferably, the resistor 50 is a metal-oxide varistor 50. The resistor 50 reduces load on the circuit by absorbing the resonant current flow after a main switch 22, 24 has been turned off by the corresponding resonant switch 38, 40, capacitor 32, 34, and inductor 36.

Figure 3:
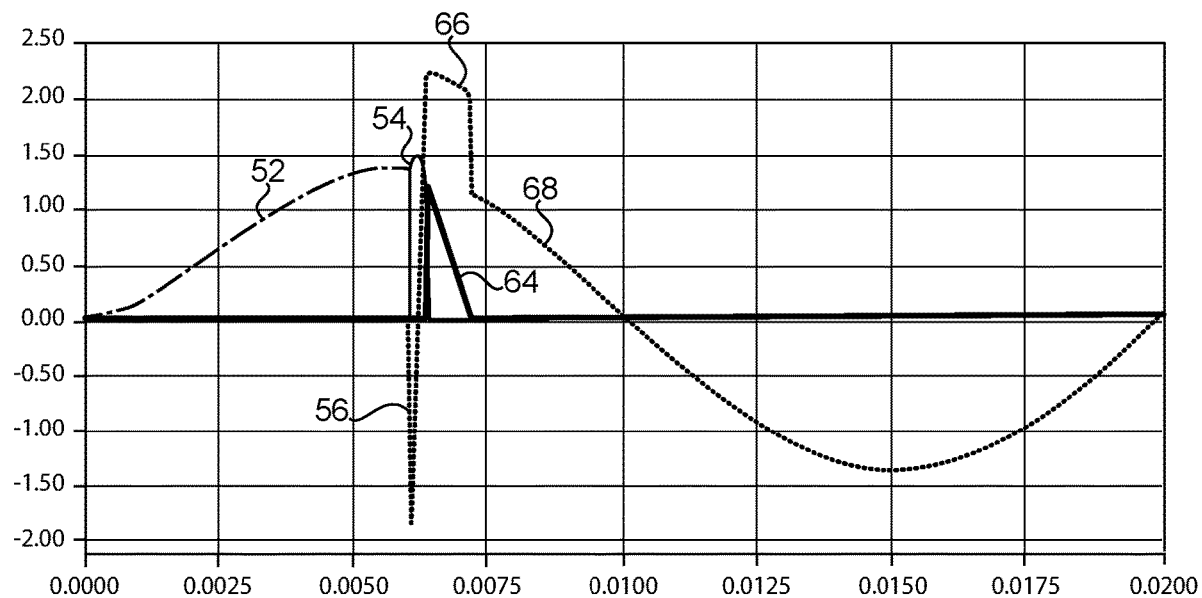
FIG. 3 is a chart showing one of the thyristors of FIG. 2 being turned off.
Figure 4:
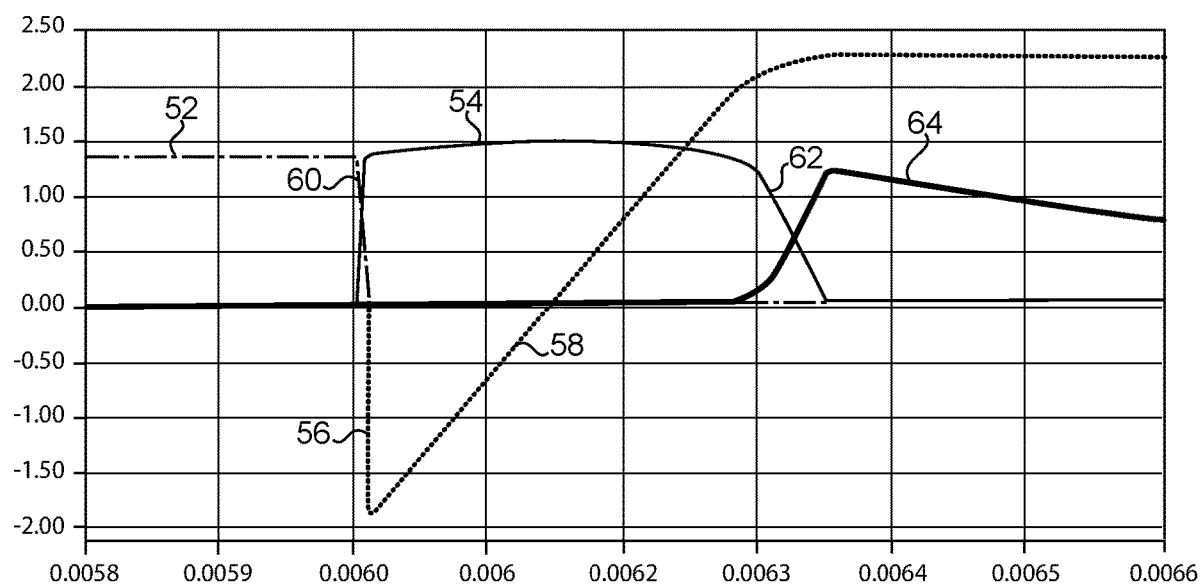
FIG. 4 is an expanded chart of FIG. 3.

Turning to FIGS. 3 and 4, a chart is shown of a resonant switch 38, 40 turning off one of the main switches 22, 24. FIG. 3 shows a longer time frame of the event, while FIG. 4 enlarges the actual switching event. As shown, current 52 through the main switch 22, 24 follows an AC cycle. In this example, it is decided to turn off the main switch 22, 24 at about the peak of the AC cycle. Thus, without the resonant switch 38, 40 circuit to turn off the main switch 22, 24 early, the main switch 22, 24 would not turn off naturally due to the AC cycle reversal for about twice as long. As further shown, when the resonant switch 38, 40 is turned on, the resonant current 54 is released which causes a sudden reversal 56 in the voltage 58 across the main switch 22, 24. As explained above, this causes the main switch 22, 24 to turn off and stop conducting electric power. This is seen in FIGS. 3 and 4 where the main switch current 52 suddenly drops 60 to zero. The resonant current 54 lasts for a relatively short time before it is dissipated 62 through the varistor 50 when the varistor current 64 increases. After the main switch 22, 24 is turned off, a temporary voltage spike 66 occurs across the switch 22, 24. Thereafter, the voltage 58 across the switch 22, 24 follows 68 the AC cycle of the power source 12.

Figure 5:
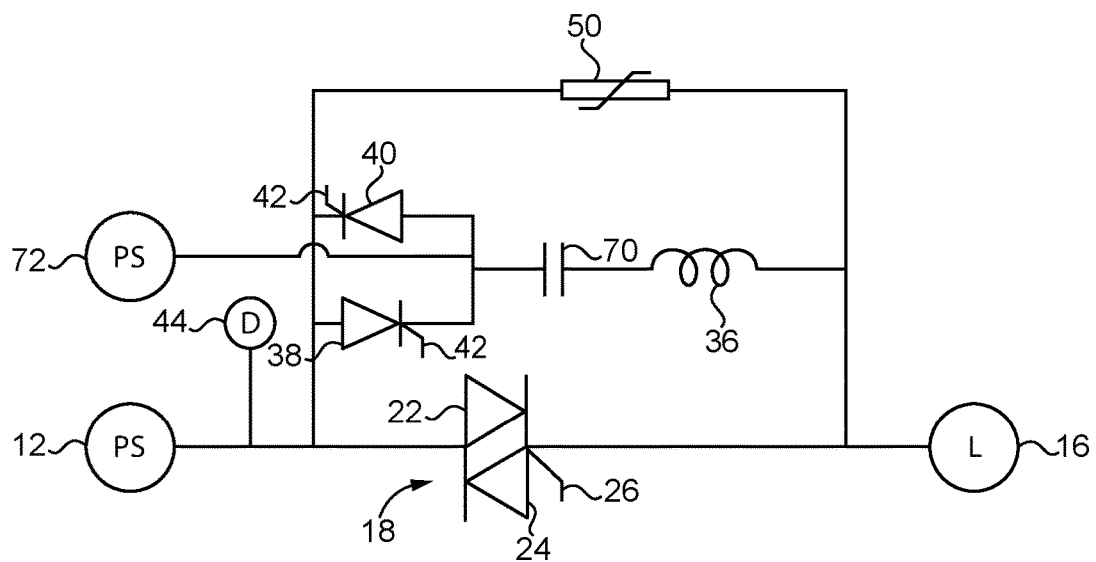
FIG. 5 is a circuit diagram of another resonant turn-off circuit.

Turning to FIG. 5, it may also be possible to use a single capacitor 70 in the circuit instead of two capacitors 32, 34 as used in FIG. 2. In this case, a single power supply 72 to charge the capacitor 70 will be used. It may be desirable for the power supply 72 to alternate the charge of the capacitor 70 corresponding to the polarity of the power source 12.

Figure 6:
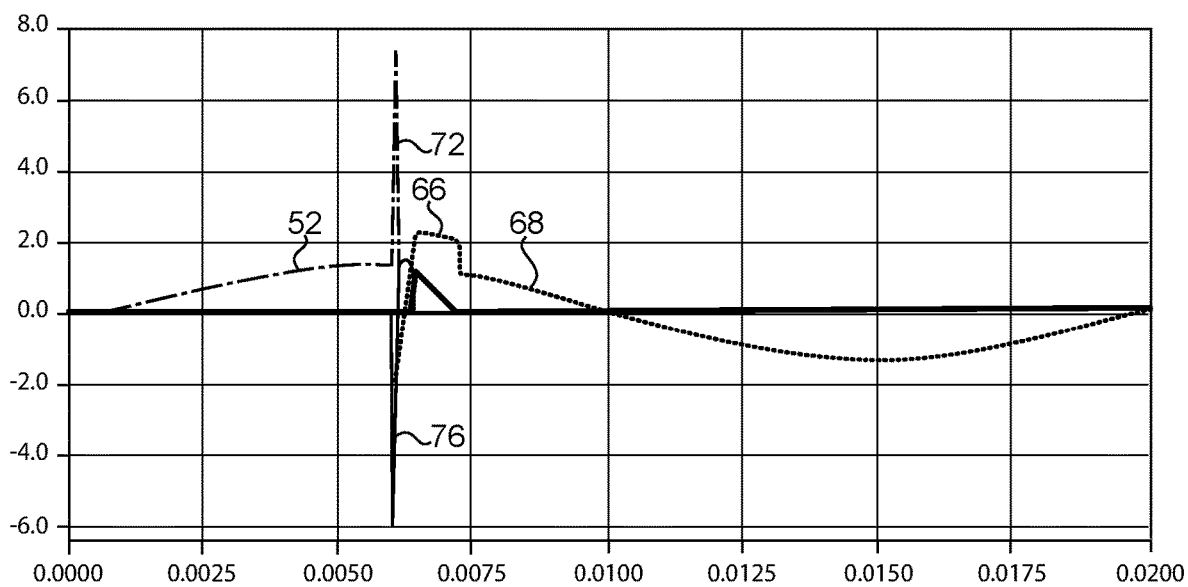
FIG. 6 is a showing one of the thyristors of FIG. 5 being turned off.
Figure 7:
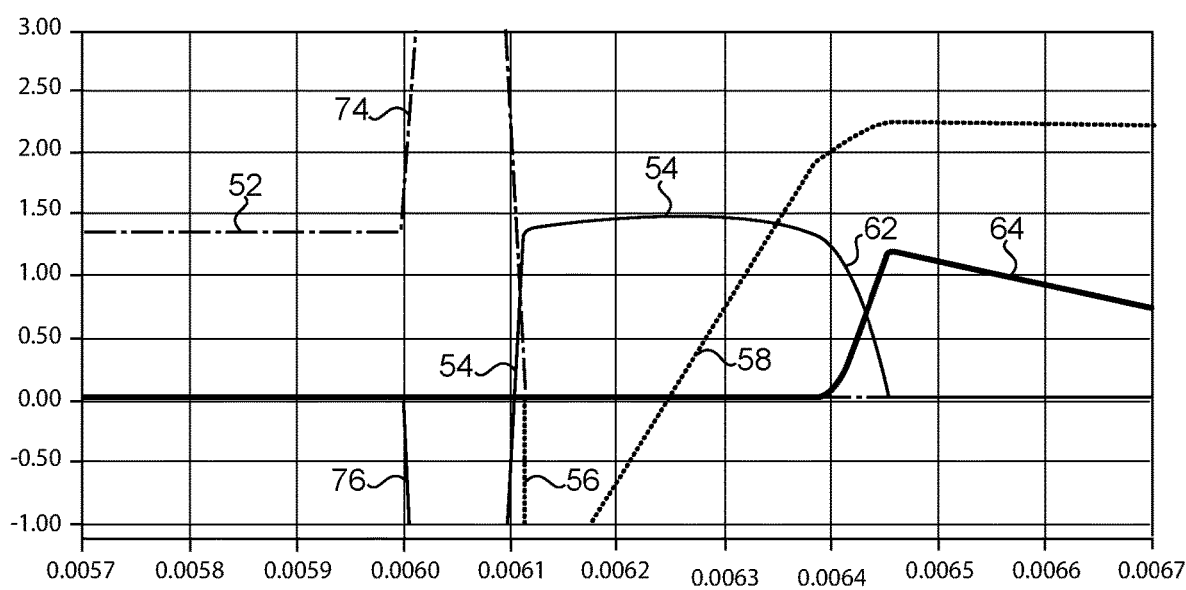
FIG. 7 is an expanded chart of FIG. 6.

FIGS. 6 and 7 are charts representing a resonant switch 38, 40 of FIG. 5 turning off the main switch 22, 24. When the resonant switch 38, 40 is turned on, and initial spike 74, 76 in the main switch current 52 and the resonant current 54 may occur. Thereafter, the resonant current 54 causes a voltage reversal 56 across the main switch 22, 24 to turn off the main switch 22, 24. The resonant current 54 is dissipated through the varistor 50 as the current 64 through the varistor 50 increases. After the main switch 22, 24 is turned off, a temporary voltage spike 66 occurs across the main switch 22, 24. Thereafter, the voltage 58 across the switch 22, 24 follows 68 the AC cycle of the power source 12.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A static transfer switch, comprising:
    first and second main switches, the first and second main switches being arranged anti-parallel to each other, the first and second main switches being turned on to conduct electric power by supplying a first gate signal to each of the first and second main switches, the first and second main switches being turned off to stop conducting electric power by reversing voltage across the first and second main switches;
    a capacitor and an inductor arranged in parallel with the first and second main switches;
    first and second resonant switches arranged in series with the capacitor and the inductor; and
    wherein a second gate signal is supplied to one of the first and second resonant switches to apply a reverse voltage across one of the first and second main switches to turn off the one of the first and second main switches in response to a positive polarity of the electric power, and the second gate signal is supplied to the other of the first and second resonant switches to apply a reverse voltage across the other of the first and second main switches to turn off the other of the first and second main switches in response to a negative polarity of the electric power.

2. The static transfer switch according to claim 1, wherein the first and second main switches are thyristors or GTOs.

3. The static transfer switch according to claim 2, wherein the first and second main switches are thyristors.

4. The static transfer switch according to claim 1, wherein the first and second resonant switches are thyristors, GTOs, IGBTs or MOSFETs.

5. The static transfer switch according to claim 4, wherein the first and second resonant switches are thyristors.

6. The static transfer switch according to claim 1, wherein the first and second resonant switches have lower capacity ratings than the first and second main switches.

7. A static transfer switch, comprising:
    first and second main switches, the first and second main switches being arranged anti-parallel to each other, the first and second main switches being turned on to conduct electric power by supplying a first gate signal to each of the first and second main switches, the first and second main switches being turned off to stop conducting electric power by reversing voltage across the first and second main switches;
    a capacitor and an inductor arranged in parallel with the first and second main switches;
    a resistor arranged in parallel with the capacitor and the inductor; and
    first and second resonant switches arranged in series with the capacitor and the inductor;
    wherein a second gate signal is supplied to at least one of the first and second resonant switches to apply a reverse voltage across one of the first and second main switches to turn off the one of the first and second main switches.

8. The static transfer switch according to claim 7, wherein the resistor is a metal-oxide varistor.

9. A static transfer switch, comprising:
    first and second main switches, the first and second main switches being arranged anti-parallel to each other, the first and second main switches being turned on to conduct electric power by supplying a first gate signal to each of the first and second main switches, the first and second main switches being turned off to stop conducting electric power by reversing voltage across the first and second main switches;
    two capacitors and an inductor arranged in parallel with the first and second main switches;
    first and second resonant switches, one of the capacitors and the inductor being arranged in series with one of the first and second resonant switches, and the other of the capacitors and the inductor being arranged in series with the other of the first and second resonant switches, an opposite charge being applied to each of the two capacitors; and
    wherein a second gate signal is supplied to at least one of the first and second resonant switches to apply a reverse voltage across one of the first and second main switches to turn off the one of the first and second main switches.

10. The static transfer switch according to claim 1, further comprising a power supply connected to the capacitor, the power supply maintaining a charge of the capacitor.

11. The static transfer switch according to claim 1, further comprising:
    a detector for monitoring a polarity of electric power supplied to the first and second main switches.

12. The static transfer switch according to claim 1,
    wherein a first power source is connected to an input of the first and second main switches, a load is connected to an output of the first and second main switches, and the first power source supplies AC power; and
    wherein, when the first and second main switches are turned on, the positive polarity of each AC cycle is conducted by the first main switch, and the negative polarity of each AC cycle is conducted by the second main switch.

13. The static transfer switch according to claim 12, wherein the first gate signal is supplied constant or constantly pulsed to each of the first and second main switches over a period of time such that polarity reversals of the AC power do not turn off the first and second main switches.

14. The static transfer switch according to claim 12,
    wherein the first and second main switches are turned off by stopping the supply of the first gate signal and by the reverse voltage applied by the one of the first and second resonant switches across the one of the first and second main switches; and wherein the reverse voltage is applied to turn off the one of the first and second main switches before a polarity reversal of the AC power from a time that the first gate signal is stopped.

15. The static transfer switch according to claim 1, further comprising:
a first power source, a second power source, and a load;
wherein the first power source is connected to an input of a first set of the first and second main switches, the second power source is connected to an input of a second set of the first and second main switches, and the load is connected to outputs of the first and second sets of the first and second main switches.

16. The static transfer switch according to claim 15, further comprising:
a first detector monitoring electric performance of the first power source;
wherein the first and second main switches of the first set are turned on to supply electric power from the first power source to the load while the first and second main switches of the second set are turned off to prevent electric power from being supplied from the second power source to the load;
wherein, upon the first detector sensing a deterioration of performance of the first power source, the first and second main switches of the first set are turned off to prevent electric power from being supplied from the first power source to the load, and the first and second main switches of the second set are turned on to supply electric power from the second power source to the load.

17. The static transfer switch according to claim 16,
wherein the first and second power sources supply AC power;
wherein, when the first and second main switches are turned on, a positive polarity of each AC cycle is conducted by the first main switch, and a negative polarity of each AC cycle is conducted by the second main switch;
wherein the first and second main switches are turned off by stopping the supply of the first gate signal and by the reverse voltage applied by the one of the first and second resonant switches across the one of the first and second main switches; and
wherein the reverse voltage is applied to turn off the one of the first and second main switches before a polarity reversal of the AC power from a time that the first gate signal is stopped.

18. The static transfer switch according to claim 17,
wherein the first gate signal is supplied constant or constantly pulsed to each of the first and second main switches over a period of time such that polarity reversals of the AC power do not turn off the first and second main switches; and
further comprising a power supply connected to the capacitor, the power supply maintaining a charge of the capacitor.

19. The static transfer switch according to claim 18, further comprising:
a second detector monitoring a polarity of electric power supplied to the first and second main switches;
wherein the first resonant switch is arranged to apply the reverse voltage across the first main switch, and the second resonant switch is arranged to apply the reverse voltage across the second main switch;
wherein the second gate signal is supplied to either the first resonant switch or the second resonant switch in response to the second detector;
further comprising a metal-oxide varistor arranged in parallel with the capacitor and the inductor; and
further comprising two of the capacitor, one of the capacitors being arranged in series with one of the first and second resonant switches, and the other of the capacitors being arranged in series with the other of the first and second resonant switches, an opposite charge being applied to each of the two capacitors.

20. The static transfer switch according to claim 19,
wherein the first and second main switches are thyristors;
wherein the first and second resonant switches are thyristors, GTOs, IGBTs or MOSFETs; and
wherein the first and second resonant switches have lower capacity ratings than the first and second main switches.

* * * * *